(12) United States Patent
Navacchia et al.

(10) Patent No.: US 11,714,100 B2
(45) Date of Patent: Aug. 1, 2023

(54) PROCESS FOR PRODUCING A PIEZOELECTRIC SENSOR AND PIEZOELECTRIC SENSOR OBTAINED BY MEANS OF SUCH A PROCESS

(71) Applicant: COMMISSARIAT A L'ENERGIE ATOMIQUE ET AUX ENERGIES ALTERNATIVES, Paris (FR)

(72) Inventors: Frédéric Navacchia, Pierrevert (FR); Laurent Brissonneau, Venelles (FR); Christian Lhuillier, Aix en Provence (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/058,119

(22) PCT Filed: May 21, 2019

(86) PCT No.: PCT/EP2019/063106
§ 371 (c)(1),
(2) Date: Nov. 23, 2020

(87) PCT Pub. No.: WO2019/228862
PCT Pub. Date: Dec. 5, 2019

(65) Prior Publication Data
US 2021/0199687 A1    Jul. 1, 2021

(30) Foreign Application Priority Data
May 30, 2018 (FR) ........................... 1854631

(51) Int. Cl.
*H10N 30/01* (2023.01)
*H10N 30/02* (2023.01)
(Continued)

(52) U.S. Cl.
CPC .............. *G01P 15/09* (2013.01); *G01P 1/023* (2013.01); *H10N 30/01* (2023.02); *H10N 30/02* (2023.02);
(Continued)

(58) Field of Classification Search
CPC ..... H01L 41/0533; H01L 41/22; H01L 41/23; H01L 41/33; H01L 41/0838;
(Continued)

(56) References Cited

U.S. PATENT DOCUMENTS

2008/0122020 A1\* 5/2008 Metz ........................ H01L 21/56
438/51
2010/0327704 A1\* 12/2010 Sakamoto ............. H01L 41/273
29/25.35
(Continued)

FOREIGN PATENT DOCUMENTS

FR        2 977 377 A1    1/2013
GB        1 510 602 A     5/1978
WO        2011/141886 A2  11/2011

*Primary Examiner* — Helen C Kwok
(74) *Attorney, Agent, or Firm* — BakerHostetler

(57) ABSTRACT

A process for producing a piezoelectric sensor includes the following steps: a step of providing a housing made of stainless steel; a step of producing a solution of a compound comprising a metal or metalloid element; a step of depositing a layer of the solution over at least one inner surface of the housing; a step of oxidizing the deposited layer of solution; a step of placing a piezoelectric element inside the housing; a step of closing the housing. A piezoelectric sensor obtained by such a process and comprising a closed steel housing, a piezoelectric element arranged inside the housing and a layer of a solution of a compound comprising a metal or metalloid element that is arranged over at least one inner surface of the housing.

16 Claims, 2 Drawing Sheets

(51) Int. Cl.
  *H10N 30/08* (2023.01)
  *H10N 30/30* (2023.01)
  *H10N 30/88* (2023.01)
  *G01P 15/09* (2006.01)
  *G01P 1/02* (2006.01)

(52) U.S. Cl.
  CPC ........... *H10N 30/08* (2023.02); *H10N 30/302* (2023.02); *H10N 30/883* (2023.02)

(58) Field of Classification Search
  CPC .... H01L 41/273; H10N 30/883; H10N 30/08; H10N 30/02; H10N 30/01; H10N 30/302
  See application file for complete search history.

(56) References Cited

U.S. PATENT DOCUMENTS

| | | |
|---|---|---|
| 2012/0195797 A1 | 8/2012 | Sparks et al. |
| 2012/0204644 A1 | 8/2012 | Varak et al. |
| 2014/0215784 A1* | 8/2014 | Lhuillier ................ H01L 41/25 29/25.35 |

\* cited by examiner

PROCESS FOR PRODUCING A PIEZOELECTRIC SENSOR AND PIEZOELECTRIC SENSOR OBTAINED BY MEANS OF SUCH A PROCESS

CROSS-REFERENCE TO RELATED APPLICATIONS

This application is a National Stage of International patent application PCT/EP2019/063106, filed on May 21, 2019, which claims priority to foreign French patent application No. FR 1854631, filed on May 30, 2018, the disclosures of which are incorporated by reference in their entirety.

FIELD OF THE INVENTION

The field of the invention is that of piezoelectric sensors, in particular those designed to operate at high temperatures, typically higher than several hundred degrees Celsius.

One example of a particular piezoelectric sensor is a device for transmitting, receiving or transceiving ultrasonic waves, more broadly acoustic waves, which can propagate through solids and fluids, also called a "high-temperature ultrasonic transducer" or "HTUST", and designed to operate at high temperatures, typically higher than several hundred degrees Celsius.

BACKGROUND

High-temperature ultrasonic transducers are suitable for use in hot environments. They are particularly suitable for use in nuclear reactors, and in particular fast-neutron nuclear reactors.

In the case of fast-neutron reactors, the correct operation of the transducers must be ensured in particular under the following indicative physical conditions:
- immersed in a liquid alloy or metal (sodium for example);
  - for a working temperature under normal conditions that varies between 200° C. (reactor stopped) and 550° C. (reactor in operation);
- for a working temperature under abnormal conditions that may reach 700° C.;
- under a stream of fast and thermal neutrons, and/or gamma photons; for an operating period of several decades (reactor service life typically of 60 years).

Ultrasonic transducers must also be able to operate at room temperature (a few degrees), especially during laboratory tests.

Ultrasonic transducers must be able to function as ultrasonic wave transmitters, ultrasonic wave receivers, or ultrasonic wave transceivers.

Lastly, transducers must be able to operate within a wide range of acoustic frequencies, typically from near-continuous to several megahertz.

Ultrasonic transducers may also be used in pressurized water reactors.

They can also find other applications in the non-nuclear industry.

The acoustic waves are generated and/or received using an element made of material that converts electrical energy into mechanical energy and/or vice versa, generally a piezoelectric material.

The piezoelectric converter element is separated from the wave propagation medium by a protective plate (generally metal or made of a metal alloy) called a "support plate" or more generally "support" in the present description, which in practice may be incorporated into a housing, or a portion of a housing, or a portion of a part to be inspected, or even of a waveguide.

The performance of an ultrasonic transducer is determined by:
- the choice of converter material;
- the choice of support material, and more generally housing material;
- the choice and implementation of the type of connection, also called "junction", between a first face of the converter material and the support, this junction having to provide mechanical and acoustic functions, that is to say to be capable of transmitting ultrasound in a wide frequency range (from near-continuous to a few megahertz) and temperature range (from a few degrees to 550° C., or even 700° C.).

On its second face, the converter material is coupled to an electrode, the coupling potentially being performed in the same way as between the converter material and the support, or potentially being performed in a different way.

The support may serve as a second electrode.

The "support/first junction/converter material/second junction/electrode" assembly may be referred to as "assembly" in the present description. It must operate (mechanically, electrically and acoustically) durably and with stable characteristics under the harsh conditions listed above.

For example, patent FR2977377 discloses a "high-temperature" ultrasonic transducer comprising junctions based on indium and gold and exhibiting very good high-temperature resistance properties.

The high-temperature ultrasonic transducer according to patent FR2977377 is illustrated in FIG. 1A. It comprises an upper electrode 12 made of steel or metal, a converter 10 made of piezoelectric material and a support 11 made of steel or metal providing the interface between the converter and the acoustic wave propagation medium, a first junction J11 between the support and the piezoelectric material, a second junction J12 between the converter and the upper electrode. The first junction is a solid joint comprising of gold and indium.

The piezoelectric material is preferably lithium niobate.

The first junction transmits the acoustic waves, and it acoustically couples the converter and the support.

The second junction may also transmit the acoustic waves, acoustically coupling the converter and the electrode. But it might also not transmit the acoustic waves, and thus acoustically decouple the converter and the electrode.

As illustrated in FIG. 1B, the high-temperature ultrasonic transducer further comprises a housing 20 incorporating the assembly composed of the support, the first junction, the second junction, and the upper electrode, the support made of steel or metal being a plate incorporated into said housing, or attached to said housing.

The piezoelectric material requires a constant oxygen content for optimum operation at high temperature.

This is because most piezoelectric materials are formed of oxides and are subject to oxygen depletion when exposed to high temperatures, inside a sealed housing, to reducing atmospheres or to a low partial pressure of oxygen. When a piezoelectric element loses oxygen, it becomes more electrically conductive, and this severe loss of resistivity, exacerbated by the increase in temperature, renders the sensor inoperative, unreliable or causes permanent damage.

For example, the harmful effects of the phenomenon known as "oxygen loss" from lithium niobate appear at high temperature (higher than about 350° C.) under low partial pressure of oxygen. The piezoelectric crystal of lithium niobate experiences loss of the acoustic signal on heating to high temperature, due to loss of oxygen from the crystal and to a decrease in electrical resistivity.

However, the housing undergoes, at operating temperatures (which may reach 550° C., or even 700° C.), oxidation on its inner surface and this reaction depletes the atmosphere in contact with the piezoelectric material of oxygen.

Even when a housing made of stainless steel is chosen, the natural layer of chromium oxide of stainless steels provides insufficient protection. This is because stainless steel comprises elements which can further combine with oxygen to form a greater oxide layer.

To counteract this phenomenon, the inner surfaces of the housing of the high-temperature ultrasonic transducer may be oxidized prior to use. However, even in this case there is still an inevitable oxidation phenomenon at high temperature which leads to the oxygen present in the housing being consumed.

To mitigate this loss of oxygen, the piezoelectric transducer may comprise aeration means that make it possible to renew the oxygen present in the housing. Aeration is thus provided, as necessary, in order to keep the piezoelectric material under a sufficient partial pressure of oxygen, at high temperature.

An aeration means for ensuring the renewal of the oxygen inside the housing enclosing the piezoelectric material may be produced by means of aeration tubes 41, 42 supplying the housing, as illustrated in FIG. 1B.

However, these aeration means make the ultrasonic transducer complex to handle.

Other drawbacks of the aeration means are the increase in the outlet diameter for the instrumentation of the housing, and overall a larger housing size, more complex manufacture of the transducer, and the need to supply the housing with air.

In addition, there is a risk of the aeration tubes becoming blocked, which may lead to deterioration of the signals over time.

Lastly, there may be a risk of leakage due to the incorporation of the aeration tubes into the housing (gap or crack, due either to a connection defect or to a manufacturing defect). For example, moisture and/or fluids may enter the housing and cause corrosion, or other internal damage to the sensor, even when it is not in operation. This phenomenon is all the more damaging when the sensor is immersed in a fluid, a leak causing its degradation and the contamination of the surrounding environment.

The same problem exists more broadly for any sensor comprising a piezoelectric material arranged in a hermetic housing.

Thus, for example, the same problem exists for a piezoelectric accelerometer comprising a piezoelectric active element arranged in a hermetic housing, said accelerometer being able to operate at high temperature, such as described in patent application US2012/0204644. The solution adopted consists in adding a small metal section made of silver (or of silver alloys) to the hermetic housing of the accelerometer in order to allow the diffusion of oxygen through the metal, when it is subjected to a high temperature. However, the housing still experiences oxidation of the previously treated surfaces after a certain time.

SUMMARY OF THE INVENTION

The invention aims to overcome the aforementioned drawbacks.

The invention aims to provide a piezoelectric sensor capable of operating at high temperature without the performance of the piezoelectric elements deteriorating over time.

The invention particularly aims to provide a piezoelectric sensor capable of preventing the loss of oxygen, more broadly of maintaining a constant oxygen content and of obtaining optimum operation of the piezoelectric material.

One subject of the invention making it possible to achieve this aim is a process for producing a piezoelectric sensor comprising the following steps:
  a step of providing a housing made of stainless steel;
  a step of producing a solution of a compound comprising a metal or metalloid element;
  a step of depositing a layer of said solution over at least one inner surface of the housing;
  a step of oxidizing the deposited layer of solution;
  a step of placing a piezoelectric element inside said housing;
  a step of closing the housing subsequent to all of the previous steps.

The deposition step is subsequent to the production step. The oxidation step is subsequent to the deposition step.

The step of placing a piezoelectric element inside the housing is preferably carried out after the oxidation step, but could be carried out before.

The step of providing the housing may be prior or subsequent the production step. It is obviously prior to the deposition step.

The housing is preferably closed hermetically.

What is understood by element is a chemical element from the periodic table of elements. It may be a metal element or a metalloid element.

A metalloid element is a chemical element whose properties are intermediate between those of metals and non-metals or are a combination of these properties. The six elements generally recognized as metalloids are boron, silicon, germanium, arsenic, antimony and tellurium.

The metal elements comprise the rare earths which are a group of metal elements with similar properties including scandium, yttrium, and the fifteen lanthanides.

The deposition and oxidation of the layer of solution of a compound comprising a metal or metalloid element results in a bonding oxide layer which acts as a diffusion barrier and ensures a very slow rate of oxidation of the stainless steel.

According to one preferred embodiment, the solution is a rare earth solution.

The rare earth solution may comprise a compound based on lanthanum, yttrium or cerium. It may comprise a combination of said compounds. According to one particular embodiment, the solution consists of a compound based on lanthanum, yttrium or cerium, or a combination of said compounds.

The rare earth solution may comprise a compound chosen from: a lanthanum oxide, a lanthanum hydroxide, a lanthanum carbonate, a lanthanum acetate, a lanthanum oxalate, an yttrium oxide, an yttrium hydroxide, an yttrium oxalate or a cerium oxide, or a combination of said compounds. According to one particular embodiment, the solution consists of a compound based on lanthanum oxide, lanthanum hydroxide, lanthanum carbonate, lanthanum acetate, lanthanum oxalate, yttrium oxide, yttrium hydroxide, yttrium oxalate or cerium oxide, or a combination of said compounds.

According to another embodiment, the solution comprises a compound based on polysilazane. According to one particular embodiment, the solution consists of a compound based on polysilazane.

According to another embodiment, the solution comprises a compound based on zirconium, for example a zirconium oxide. According to one particular embodiment, the solution consists of a compound based on zirconium.

According to one embodiment, the deposition step is carried out by dipping the housing into the solution (dip coating). This dipping step is followed by a removal step.

According to one alternative embodiment, the deposition step is carried out by spin-coating the solution onto the housing.

According to one alternative embodiment, the deposition step is carried out by spraying the solution onto the housing (spray coating).

According to one alternative embodiment, the deposition step is carried out by applying the solution to the housing with a paintbrush, a pad or a brush.

According to one embodiment, the steps of producing the solution and of depositing a layer of said solution over at least one inner surface of the housing are carried out by means of a sol-gel process.

According to one particular embodiment, the sol-gel process comprises a step of condensing the layer of solution, said condensation step being subsequent to the deposition step, and prior to the oxidation step. The condensation temperature is preferably lower than or equal to 100° C.

According to one preferred embodiment, the oxidation step is carried out at a temperature higher than the temperature of use of the piezoelectric sensor. This makes it possible to form a protective layer which greatly decreases the oxygen depletion of the piezoelectric elements at high temperature.

According to one particular embodiment, the oxidation step is carried out at a temperature higher than 500° C., preferably at a temperature higher than or equal to 600° C.

Another subject of the invention is a piezoelectric sensor comprising:
 a hermetically closed steel housing;
 a piezoelectric element arranged within said housing.

The piezoelectric sensor further comprises a layer of a solution of a compound comprising a metal or metalloid element, said layer being arranged over at least one inner surface of the housing.

Preferably, the layer of a solution of a compound comprising a metal or metalloid element is oxidized at a temperature higher than the temperature of use of said piezoelectric sensor.

According to one preferred embodiment, the solution is a rare earth solution.

The rare earth solution may comprise a compound based on lanthanum, yttrium or cerium. It may comprise a combination of said compounds.

The rare earth solution may comprise a compound chosen from: a lanthanum oxide, a lanthanum hydroxide, a lanthanum carbonate, a lanthanum acetate, a lanthanum oxalate, an yttrium oxide, an yttrium hydroxide, an yttrium oxalate or a cerium oxide, or a combination of said compounds.

According to one alternative embodiment, the solution comprises a compound based on polysilazane.

According to one alternative embodiment, the solution comprises a compound based on zirconium, for example a zirconium oxide.

According to one preferred embodiment, the piezoelectric sensor is a high-temperature ultrasonic transducer.

According to one particular embodiment, the piezoelectric element is a converter made of piezoelectric material, and the high-temperature ultrasonic transducer further comprises, in the housing:
 an upper electrode made of steel or metal;
 a support made of steel or metal providing the interface between the converter and the acoustic wave propagation medium;
 a first junction between the support and the converter made of piezoelectric material, consisting of a solid joint comprising gold and indium;
 a second junction between the converter and the upper electrode.

According to another embodiment, the piezoelectric sensor is an accelerometer.

BRIEF DESCRIPTION OF THE DRAWINGS

Other features and advantages of the invention will become apparent through the description which follows by way of non-limiting illustration, given with reference to the appended figures, in which.

DETAILED DESCRIPTION

Figure 1A:
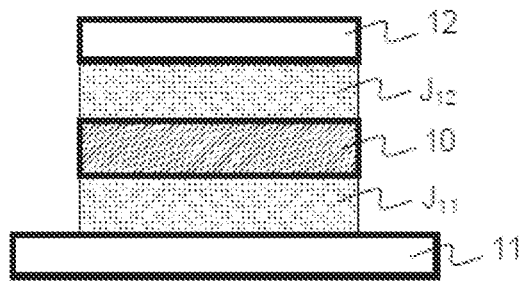
FIGS. 1A and 1B illustrate a high-temperature ultrasonic transducer of the prior art.
Figure 1B:
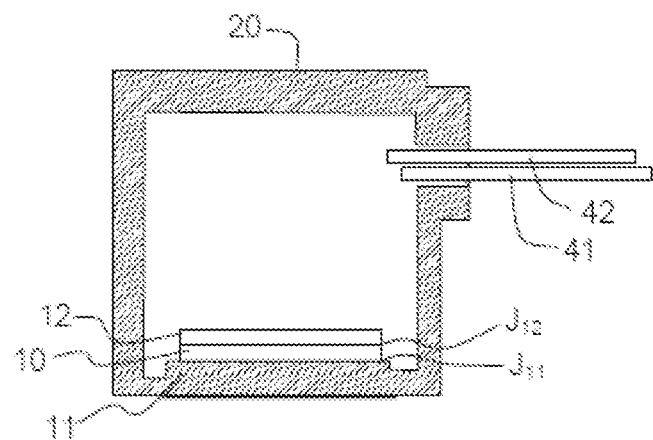

FIGS. 1A and 1B have already been described and will not be returned to here.

Figure 2:
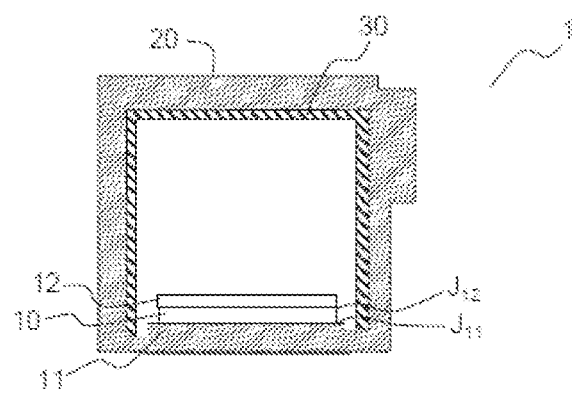
FIG. 2 illustrates a piezoelectric sensor according to the invention.

FIG. 2 illustrates a piezoelectric sensor 1 according to the invention, comprising a housing 20 in which at least one piezoelectric active element 10 is arranged.

Additionally, the piezoelectric sensor 1 comprises a layer 30 of a solution of a compound comprising metal or metalloid elements, for example rare earths. Said layer is deposited on inner surfaces of said housing. Said deposited layer is then oxidized, preferably at a temperature higher than the temperature of use of the piezoelectric sensor 1.

In the case of a high-temperature ultrasonic transducer, the piezoelectric active element 10 may be a converter made of piezoelectric material, and the sensor may further comprise, in the housing 20, an upper electrode 12 made of steel or metal, a support 11 made of steel or metal providing the interface between the converter and the acoustic wave propagation medium, a first junction $J_{11}$ between the support and the piezoelectric material, a second junction J12 between the converter and the upper electrode. The first junction $J_{11}$ may consist of a solid joint comprising gold and indium.

Figure 3:
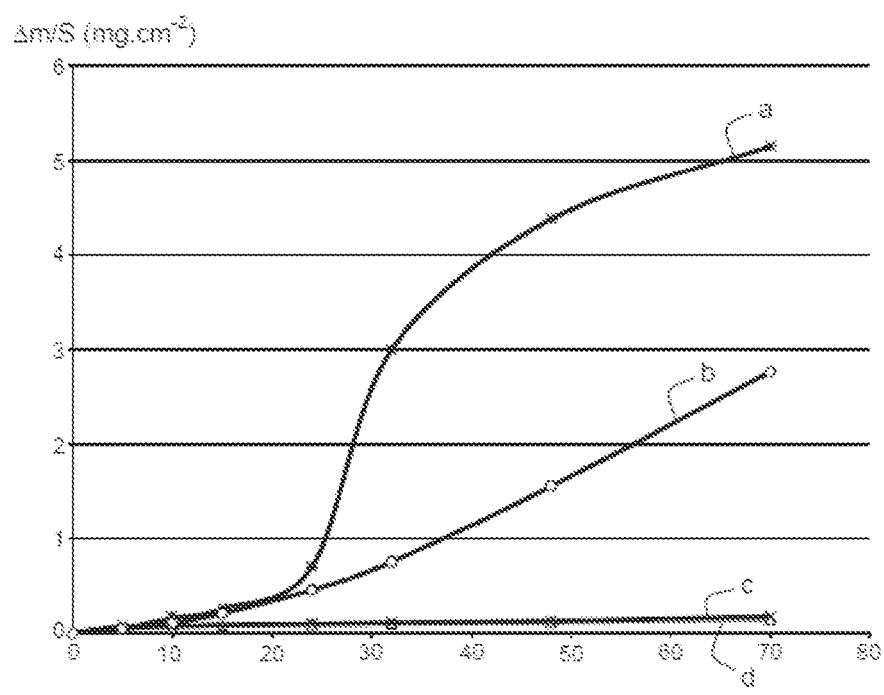
FIG. 3 illustrates the mass variation curves of the stainless steel of a housing not treated according to the invention and of a housing treated according to the invention.

FIG. 3 shows mass variation curves of a 304L stainless steel over 70 h for a housing not treated according to the invention and for a housing treated according to the invention.

In the graph of FIG. 3, it can be seen that the untreated 304L stainless steel (curves a and b) is oxidized very significantly after about 20 hours. This is due to the formation of iron-containing oxides such as $FeCr_2O_4$ and $Fe_2O_3$. The oxide layer tends to come away on cooling.

The deposition and oxidation of a lanthanum layer according to the process of the invention (curves c and d) decrease the rate of oxidation by a factor of at least ten, to such an extent that time has practically no effect on oxidation. The appearance of the mass gain curves (expressed in $mg \cdot cm^{-2}$) indicates that the metal is well protected. Lanthanum is found in the form of lanthanum chromite $LaCrO_3$ and the doping of the chromia $Cr_2O_3$ layer promotes internal anionic diffusion, a slow rate and good bonding of the layer.

The deposition and oxidation of the lanthanum layer results in a bonding oxide layer which acts as a diffusion barrier and ensures a very slow rate of oxidation of the stainless steel.

In order to carry out the steps of producing a solution and of depositing a layer of said solution over at least one surface inside the housing, a sol-gel method is preferably used, prior to the oxidation step.

A sol-gel method implements a first step of producing a rare earth hydroxide solution, the first step also being called the hydrolysis reaction. The solution thus obtained is called a "sol".

According to one particular embodiment, a solution of lanthanum hydroxide is produced.

By way of example, a solution of lanthanum hydroxide is produced from lanthanum nitrates. Water, lanthanum nitrate, and ammonia are mixed to form a lanthanum hydroxide precipitate, according to the reaction:

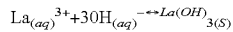

$$La_{(aq)}^{3+} + 3OH_{(aq)}^{-} \leftrightarrow La(OH)_{3(S)}$$

The lanthanum hydroxide precipitate is then dissolved in acid until the pH stabilizes. The final concentration is adjusted with water. An ionic solution of lanthanum hydroxide is obtained.

The sol-gel process then comprises a second step of depositing a thin layer of the rare earth hydroxide solution (for example lanthanum hydroxide solution) over one or more inner surfaces of the housing.

The deposition step may be carried out by dipping the housing to be coated into the solution produced, for example into the lanthanum hydroxide solution produced from lanthanum nitrates.

Alternatively, the deposition step may be carried out by applying the solution produced over one or more surfaces of the housing using a paintbrush, or alternatively by spraying the solution produced over one or more surfaces of the housing.

The sol-gel process then comprises a third step of densifying of the thin layer (also called the condensation step), at a temperature lower than or equal to 100° C., or even at room temperature. A "gel" is thus obtained.

The condensation step forms a "gel" layer a few microns thick.

The condensation step is followed by a step of high-temperature oxidation of the layer of solution. During the oxidation step, said layer reacts with the metal constituents of the stainless steel, forming other oxides which are more protective than the layer of chromia present naturally.

The duration of the oxidation step is preferably several hours. The duration is preferably longer than 24 hours, preferably longer than 48 hours and even more preferably longer than 72 hours.

In addition, the oxidation is preferably carried out at a temperature higher than the temperature of use of the piezoelectric sensor, i.e. higher than 500° C., and preferably higher than or equal to 600° C. This makes it possible to form a protective layer which greatly decreases the oxygen depletion of the piezoelectric elements at high temperature under specific conditions of use.

This straightforward-to-implement and highly economical process makes it possible to increase the service life of the piezoelectric sensor and to provide said sensor with better resistance to oxidation.

The different embodiments may be combined with one another.

In addition, the present invention is not limited to the embodiments described above but rather extends to any embodiment that comes within the scope of the claims.

The piezoelectric sensors may be accelerometers, HTU-STs or even other sensors, and in particular sensors which are liable to release oxygen at temperatures higher than or equal to 500° C.

The invention claimed is:

1. A process for producing a piezoelectric sensor comprising the following steps:
    a step of providing a housing made of stainless steel;
    a step of producing a solution of a compound comprising a metal or metalloid element;
    a step of depositing a layer of said solution over at least one inner surface of the housing;
    a step of oxidizing the deposited layer of solution;
    a step of placing a piezoelectric element inside said housing;
    a step of hermetically closing the housing, subsequent to all of the previous steps.

2. The process as claimed in claim 1, the solution being a rare earth solution.

3. The process as claimed in claim 2, the rare earth solution comprising a compound based on lanthanum, yttrium, cerium or a combination of said compound.

4. The process as claimed in claim 2, the rare earth solution comprising a compound chosen from a lanthanum oxide, a lanthanum hydroxide, a lanthanum carbonate, a lanthanum acetate, a lanthanum oxalate, an yttrium oxide, an yttrium hydroxide, an yttrium oxalate, a cerium oxide or a combination of said compound.

5. The process as claimed in claim 1, the solution comprising a compound based on polysilazane.

6. The process as claimed in claim 1, the solution comprising a compound based on zirconium.

7. The process as claimed in claim 1, the step of depositing being carried out by dipping the housing into the solution.

8. The process as claimed in claim 1, the step of depositing being carried out by spin-coating the solution onto the housing.

9. The process as claimed in claim 1, the step of depositing being carried out by spraying the solution onto the housing.

10. The process as claimed in claim 1, the step of depositing being carried out by applying the solution to the housing with a paintbrush, a pad or a brush.

11. The process as claimed in claim 1, the steps of producing the solution and of depositing the layer of said solution over at least one inner surface of the housing being carried out by a sol-gel process.

12. The process as claimed in claim 11, the sol-gel process comprising the step of condensing the layer of solution at a temperature lower than or equal to 100° C., said step of condensing being subsequent to the step of depositing, and prior to the step of oxidizing.

13. The process as claimed in claim 1, the step of oxidizing being carried out at a temperature higher than a temperature of use of the piezoelectric sensor.

14. The process as claimed in claim 1, the step of oxidizing being carried out at a temperature higher than 500° C.

15. The process as claimed in claim 6, the compound based on zirconium being an zirconium oxide.

16. The process as claimed in claim 14, the step of oxidizing being carried out at a temperature higher than or equal to 600° C.

\* \* \* \* \*